United States Patent
Robinson et al.

(10) Patent No.: US 6,599,836 B1
(45) Date of Patent: Jul. 29, 2003

(54) PLANARIZING SOLUTIONS, PLANARIZING MACHINES AND METHODS FOR MECHANICAL OR CHEMICAL-MECHANICAL PLANARIZATION OF MICROELECTRONIC-DEVICE SUBSTRATE ASSEMBLIES

(75) Inventors: Karl M. Robinson, Boise, ID (US); Scott G. Meikle, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/289,791

(22) Filed: Apr. 9, 1999

(51) Int. Cl.[7] ............................................. H01L 21/00
(52) U.S. Cl. .................... 438/691; 156/345.12; 216/38; 216/89; 438/690; 438/693
(58) Field of Search ................. 438/690, 691, 438/692, 693; 156/345.12; 498/745; 216/38, 88, 89

(56) References Cited

U.S. PATENT DOCUMENTS

| | | | |
|---|---|---|---|
| 5,264,010 A | 11/1993 | Brancaleoni et al. ......... 51/308 |
| 5,725,417 A | 3/1998 | Robinson | |
| 5,863,838 A | * 1/1999 | Farkas et al. ............... 438/693 |
| 5,868,896 A | 2/1999 | Robinson et al. | |
| 5,882,248 A | 3/1999 | Wright et al. | |
| 5,893,754 A | * 4/1999 | Robinson et al. ........... 438/692 |
| 5,904,159 A | 5/1999 | Kato et al. | |
| 5,932,486 A | 8/1999 | Cook et al. .................. 438/692 |
| 5,981,396 A | * 11/1999 | Robinson et al. ........... 438/692 |
| 6,046,111 A | 4/2000 | Robinson .................... 438/693 |
| 6,077,437 A | 6/2000 | Hayashi et al. | |
| 6,083,840 A | * 7/2000 | Mravic et al. .............. 438/693 |
| 6,093,649 A | 7/2000 | Roberts et al. ............. 438/691 |
| 6,124,207 A | 9/2000 | Robinson et al. ........... 438/692 |

* cited by examiner

*Primary Examiner*—William A. Powell
(74) *Attorney, Agent, or Firm*—Dorsey & Whitney LLP

(57) ABSTRACT

Planarizing solutions, planarizing machines and methods for planarizing microelectronic-device substrate assemblies using mechanical and/or chemical-mechanical planarizing processes. In one aspect of the invention, a microelectronic-device substrate assembly is planarized by abrading material from the substrate assembly using a plurality of first abrasive particles and removing material from the substrate assembly using a plurality of second abrasive particles. The first abrasive particles have a first planarizing attribute, and the second abrasive particles have a second planarizing attribute. The first and second planarizing attributes are different from one another to preferably selectively remove topographical features from substrate assembly and/or selectively remove different types of material at the substrate surface.

38 Claims, 9 Drawing Sheets

PLANARIZING SOLUTIONS, PLANARIZING MACHINES AND METHODS FOR MECHANICAL OR CHEMICAL-MECHANICAL PLANARIZATION OF MICROELECTRONIC-DEVICE SUBSTRATE ASSEMBLIES

TECHNICAL FIELD

The present invention relates to planarizing solutions, planarizing machines and methods for planarizing microelectronic-device substrate assemblies using mechanical and/or chemical-mechanical planarization processes.

BACKGROUND OF THE INVENTION

Mechanical and chemical-mechanical planarizing processes (collectively "CMP") are used in the manufacturing of microelectronic devices for forming a flat surface on semiconductor wafers, field emission displays and many other microelectronic-device substrate assemblies. CMP processes generally remove material from a substrate assembly to create a highly planar surface at a precise elevation in the layers of material on the substrate assembly.

FIG. 1 schematically illustrates an existing web-format planarizing machine 10 for planarizing a substrate assembly 12. The planarizing machine 10 has a support table 14 with a top panel 16 at a workstation where an operative portion (A) of a polishing pad 40 is positioned. The top panel 16 is generally a rigid plate to provide a flat, solid surface to support the operative section of the polishing pad 40 during planarization.

The planarizing machine 10 also has a plurality of rollers to guide, position and hold the polishing pad 40 over the top panel 16. The rollers include a supply roller 20, first and second idler rollers 21a and 21b, first and second guide rollers 22a and 22b, and a take-up roller 23. The supply roller 20 carries an unused or preoperative portion of the polishing pad 40, and the take-up roller 23 carries a used or post-operative portion of the polishing pad 40. Additionally, the first idler roller 21a and the first guide roller 22a stretch the polishing pad 40 over the top panel 16 to hold the polishing pad 40 stationary during operation. A drive motor (not shown) drives at least one of the supply roller 20 and the take-up roller 23 to sequentially advance the polishing pad 40 across the top panel 16. As such, clean preoperative sections of the polishing pad 40 may be quickly substituted for used sections to provide a consistent surface for planarizing the substrate assembly 12.

The web-format planarizing machine 10 also has a carrier assembly 30 that controls and protects the substrate assembly 12 during planarization. The carrier assembly 30 generally has a carrier head 31 with a plurality of vacuum holes 32 to pick up and release the substrate assembly 12 at appropriate stages of the planarizing cycle. A plurality of nozzles 41 attached to the carrier head 31 dispense a planarizing solution 42 onto a planarizing surface 43 of the polishing pad 40. The carrier assembly 30 also generally has a support gantry 34 carrying a drive assembly 35 that translates along the gantry 34. The drive assembly 35 generally has actuator 36, a drive shaft 37 coupled to the actuator 36, and an arm 38 projecting from the drive shaft 37. The arm 38 carries the carrier head 31 via another shaft 39 such that the drive assembly 35 orbits the carrier head 31 about an axis B-B offset from a center point C-C of the substrate assembly 12.

The polishing pad 40 and the planarizing solution 42 define a planarizing medium that mechanically and/or chemically-mechanically removes material from the surface of the substrate assembly 12. The web-format planarizing machine 10 typically uses a fixed-abrasive polishing pad having a plurality of abrasive particles fixedly bonded to a suspension material. The planarizing solutions 42 used with fixed-abrasive pads are generally "clean solutions" without abrasive particles because the abrasive particles in conventional abrasive CMP slurries may ruin the abrasive surface of fixed-abrasive pads. In other applications, the polishing pad 40 may be a nonabrasive pad composed of a polymeric material (e.g., polyurethane), a resin, or other suitable materials without abrasive particles. The planarizing solutions 42 used with nonabrasive polishing pads are typically "abrasive" CMP slurries with abrasive particles.

To planarize the substrate assembly 12 with the planarizing machine 10, the carrier assembly 30 presses the substrate assembly 12 against the planarizing surface 43 of the polishing pad 40 in the presence of the planarizing solution 42. The drive assembly 35 then orbits the carrier head 31 about the offset axis B-B to translate the substrate assembly 12 across the planarizing surface 43. As a result, the abrasive particles and/or the chemicals in the planarizing medium remove material from the surface of the substrate assembly 12.

CMP processes should consistently and accurately produce a uniformly planar surface on the substrate assembly 12 to enable precise fabrication of circuits and photo-patterns. During the fabrication of transistors, contacts, interconnects and other components, many substrate assemblies develop large "step heights" that create a "topographical" surface across the substrate assembly 12. For the purposes of the present application, a "topographical" surface is a non-planar surface having high and low regions. To enable the fabrication of integrated circuits with high densities of components, it is necessary to produce a highly planar surface at several stages of processing the substrate assembly 12 because even slightly topographical surfaces significantly increase the difficulty of forming submicron features. For example, it is difficult to accurately focus photo-patterns to within tolerances of 0.1 $\mu$m on topographical surfaces because submicron photolithographic equipment generally has a very limited depth of field. Thus, CMP processes are often used to transform a topographical surface into a highly uniform, planar surface.

In the competitive semiconductor industry, it is also highly desirable to produce such a uniformly planar surface at a desired endpoint on a substrate assembly. For example, when a conductive layer on the substrate assembly 12 is under-planarized in the formation of contacts or interconnects, many of these components may not be electrically isolated from one another because undesirable portions of the conductive layer may remain on the substrate assembly 12. Additionally, when a substrate assembly 12 is over-planarized, components below the desired endpoint may be damaged or completely destroyed. Thus, to provide a high yield of operable microelectronic devices, CMP processing should remove material until the desired endpoint is reached.

To accurately create highly planar substrate surfaces at the desired endpoint, many CMP applications should initially remove material from high regions on topographical surfaces faster than low regions to change the topographical surface to a planar "blanket" surface. After creating a blanket surface on the substrate assembly, CMP applications should remove material from the blanket surface as quickly as possible without adversely affecting its planarity. The CMP processes should then stop removing material at the desired endpoint on the substrate assembly.

One problem with existing CMP techniques, however, is that it is difficult to selectively remove material from high regions on topographical surfaces without also removing significant amounts of material from low regions. It is also difficult to quickly remove material from a blanket substrate surface. For example, many existing CMP techniques that can selectively remove material from high regions on a topographical substrate surface are limited because they have very low polishing rates of the blanket surface. Such topographically selective CMP techniques are thus ineffective at expediently removing material from the blanket surface. Conversely, existing CMP techniques that have high polishing rates of blanket surfaces do not remove high regions on topographical surfaces without also removing material from low regions. Thus, existing CMP techniques generally do not provide both highly selective planarization of high regions on topographical surfaces and fast removal of material from blanket surfaces.

Another problem of CMP processing is that it is difficult to accurately stop planarization at the desired endpoint. One technique for accurately endpointing CMP processing is stop-on-feature ("SOF") planarization in which a hard polish-stop layer of material having a relatively low polishing rate is formed on the substrate assembly so that the polish-stop layer has high points at the desired endpoint of the planarizing process. A softer cover layer of material having a higher polishing rate is then deposited over the polish-stop layer. The polish-stop layer resists planarization at the desired endpoint because the cover layer planarizes faster than exposed high points of the polish-stop layer. Even SOF planarizing techniques, however, may not accurately endpoint CMP processing because the difference in polishing rates between the cover layer and the polish-stop layer may cause "dishing" in the cover layer at contacts, damascene lines, shallow-trench-isolation structures, and other areas one the substrate surface where the cover layer dips below the exposed surfaces of the polish-stop layer. Thus, another problem of CMP processing is accurately stopping planarization at the desired endpoint.

SUMMARY OF THE INVENTION

The present invention is directed toward planarizing solutions, planarizing machines and methods for planarizing microelectronic-device substrate assemblies using mechanical and/or chemical-mechanical planarizing processes. In one aspect of the invention, a microelectronic-device substrate assembly is planarized by abrading material from the substrate assembly using a plurality of first abrasive particles and removing material from the substrate assembly using a plurality second abrasive particles. The first abrasive particles have a first planarizing attribute, and the second abrasive particles have a second planarizing attribute. The first and second planarizing attributes are different from one another to preferably selectively remove topographical features from the substrate assembly and/or selectively remove different types of material at the substrate surface.

In one particular application of a method in accordance with the invention, the first and second abrasive particles are mixed together in a single slurry including a liquid mixture, a plurality of the first abrasive particles, and a plurality of the second abrasive particles. The single slurry is then deposited onto a polishing pad to provide an abrasive medium having both the first and second abrasive particles. Thus, during a planarizing cycle in accordance with this embodiment, the first abrasive particles abrade material from the substrate assembly at the same time that the second abrasive particles remove material from the substrate assembly.

In an alternative method in accordance with the invention, the first abrasive particles are suspended in a first planarizing solution that is deposited onto the polishing pad during the first stage of the planarizing cycle, and the second abrasive particles are suspended in a separate second planarizing solution that is deposited onto the polishing pad during a second stage of the planarizing cycle. The first and second stages of the planarizing cycle are preferably separate, distinct periods of the planarizing cycle. During the first stage of the planarizing cycle, the first solution is preferably deposited on the polishing pad to selectively remove high regions from a topographical substrate surface. During the second stage of the planarizing cycle, which occurs after the substrate surface becomes planar, the first solution is preferably removed from the polishing pad and the second solution is deposited onto the polishing pad to quickly remove material from the planar surface.

In still another aspect of the invention, the first and second planarizing attributes of the first and second abrasive particles can be the particle size and/or the composition of the abrasive particles. For example, the first abrasive particles can have a first particle size distribution with a first mode and the second abrasive particles can have a second particle size distribution with a second mode. The first and second particle size distributions are preferably selected so that the first abrasive particles selectively planarize high regions on topographical substrate surfaces and the second abrasive particles quickly planarize blanket substrate surfaces. Alternatively, the first abrasive particles can be composed of a first material and the second abrasive particles can be composed of a second material. The first and second materials are preferably selected so that the first abrasive particles aggressively planarize a first type of material on the substrate assembly and the second abrasive particles planarize a second type of material on the substrate assembly either more or less aggressively than the first type of material. The first abrasive particles can also have a first particle size distribution with a first mode and be composed of a first material, and the second abrasive particles can also have a second particle size distribution with a second mode and be composed of a second material.

DETAILED DESCRIPTION OF EMBODIMENTS OF THE INVENTION

The present invention is directed toward planarizing solutions, planarizing machines and methods for planarizing microelectronic-device substrate assemblies using mechanical and/or chemical-mechanical planarization processes. Many specific details of certain embodiments of the invention are set forth in FIGS. 2–9 and the following description to provide a thorough understanding of such embodiments. One skilled in the art, however, will understand that the present invention may have additional embodiments, or that certain embodiments of the invention may be practiced without several of the details described the following description.

Figure 2:
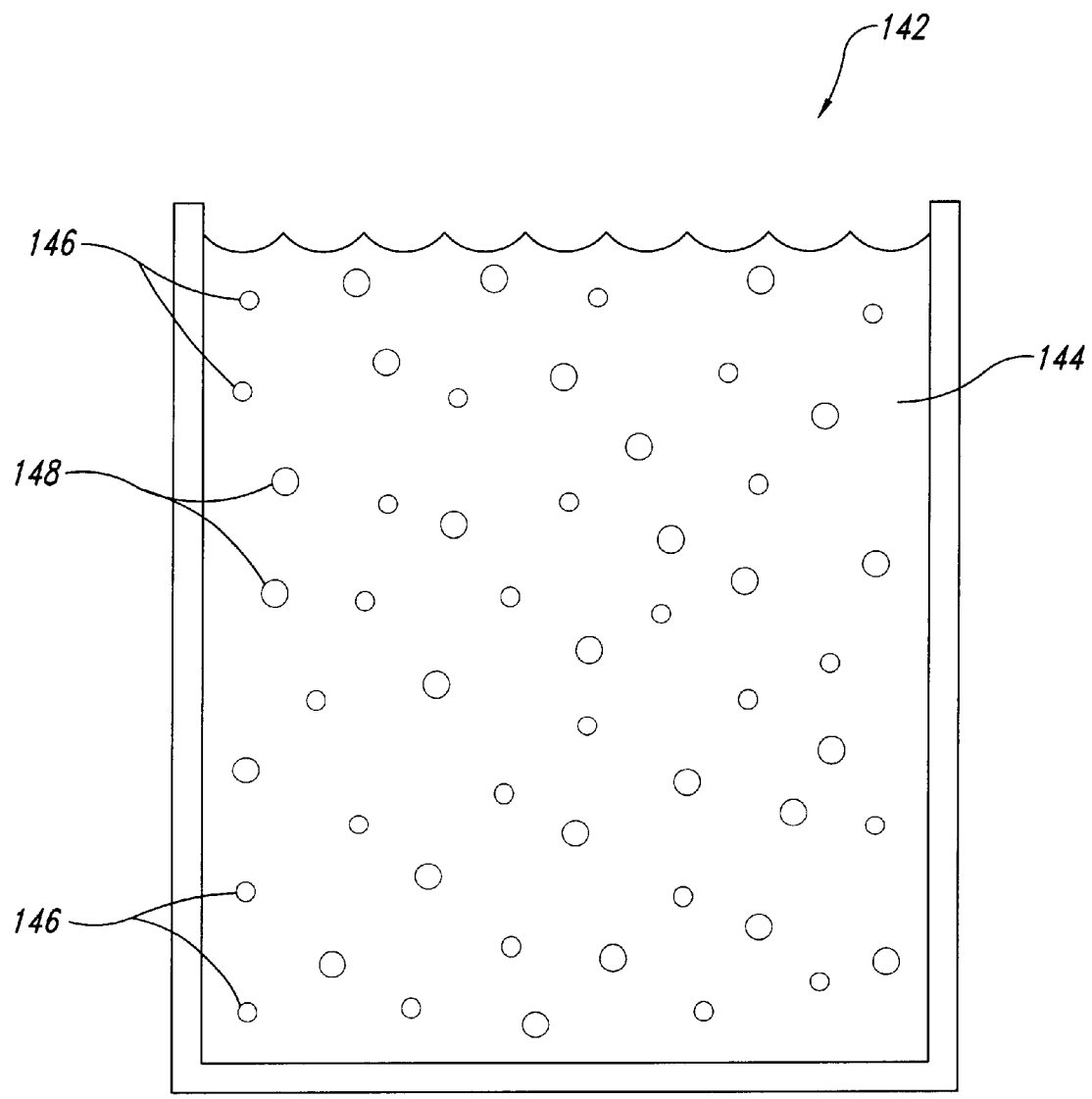
FIG. 2 is a schematic side view of a planarizing solution in accordance with an embodiment of the invention.

FIG. 2 is a schematic view of a planarizing solution 142 in accordance with one embodiment of the invention for selectively removing material from a substrate assembly. In this embodiment, the planarizing solution 142 includes a liquid mixture 144, a plurality of first abrasive particles 146, and a plurality of second abrasive particles 148. The liquid mixture 144 is preferably composed of water, solvents, surfactants, dispersants, oxidants and/or other suitable additives for CMP planarizing solutions. In this embodiment, the first and second abrasive particles 146 and 148 are preferably composed of the same material, but, as explained below, they can also be composed of different materials. Suitable materials for the first and second abrasive particles 146 and 148 include aluminum oxide, ceria, silicon dioxide, titanium oxide, titania, tantalum oxide, ceria treated silica, silica and/or other suitable abrasive particles for removing material from microelectronic device substrate assemblies.

The first and second planarizing particles 146 and 148 have specific planarizing attributes that control certain aspects of the planarizing process. More particularly, the first abrasive particles 146 have a first planarizing attribute that imparts a desired planarizing property to the first abrasive particles 146, and the second abrasive particles 148 have a second planarizing attribute that imparts a different planarizing property to the second abrasive particles 148. In this particular embodiment, the first and second planarizing attributes of the first and second abrasive particles 146 and 148 are the particle sizes of the first and second abrasive particles 146 and 148. The first abrasive particles 146, for example, have smaller particle sizes relative to the second abrasive particles 148. The planarizing solution 142 is accordingly a bimodal solution in which the first abrasive particles 146 have particle sizes in a first particle size distribution with a first mode and the second abrasive particles 148 have particle sizes in a second particle size distribution with a second mode.

Figure 3:
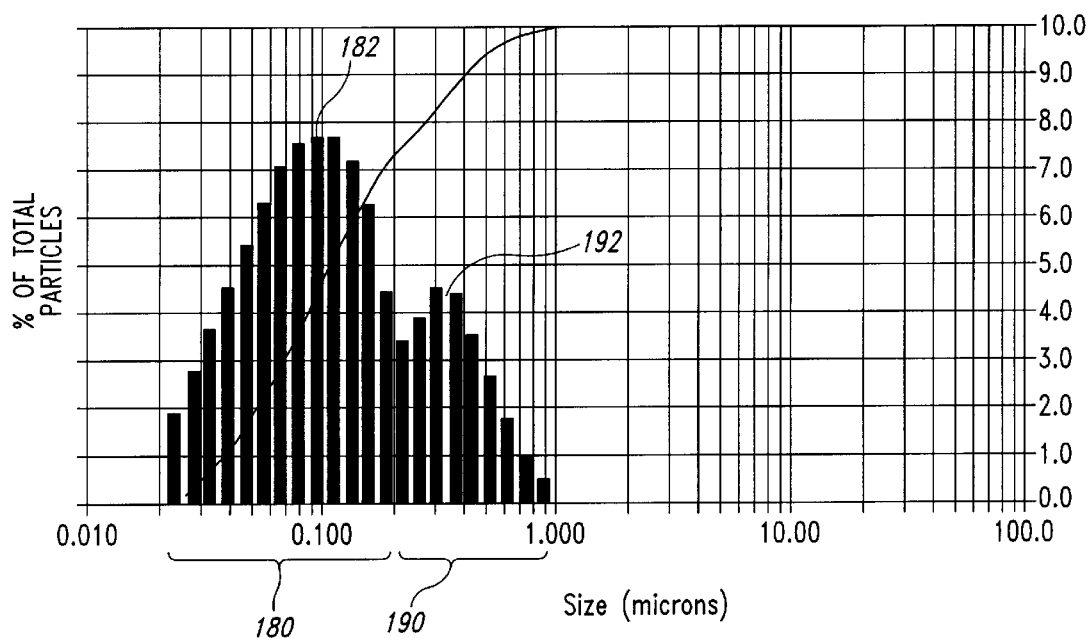
FIG. 3 is a bar graph illustrating a bi-modal planarizing solution in accordance with an embodiment of the invention having a plurality of first abrasive particles in a first particle size distribution with a first mode and a plurality of second abrasive particles in a second particle size distribution with a second mode.

FIG. 3 is a bar graph illustrating one embodiment of the first and second particle size distributions for the first and second abrasive particles 146 and 148 of the planarizing solution 142. The first abrasive particles 146 can have a first particle size distribution 180 between 0.020 µm and 0.20 µm with a first mode 182 at approximately 0.10 µm. The second abrasive particles 148 can have a second particle size distribution 190 between 0.20 µm and 1.0 µm with a second mode 192 at approximately 0.3 µm. The first and second particle size distributions 180 and 190 can also cover other ranges of particle sizes, and the particle sizes of the first and second modes 182 and 192 can also be different. For example, the first abrasive particles 146 can have a first size distribution from 0.010–0.050 µm with a first mode at approximately 0.020–0.030 µm, and the second abrasive particles 148 can have a second size distribution from 0.070–0.40 µm with second mode of approximately 0.25–0.30 µm. Moreover, the planarizing solution 142 can have more than two modes to create more than two particle size distributions. As explained below, the particular range and mode of each particle size distribution can be chosen to selectively remove high regions from topographical substrate surfaces, quickly remove material from blanket substrate surfaces, selectively remove different types of material, or impart other planarizing properties to the planarizing solution 142 according to the particular CMP application.

Figure 4:
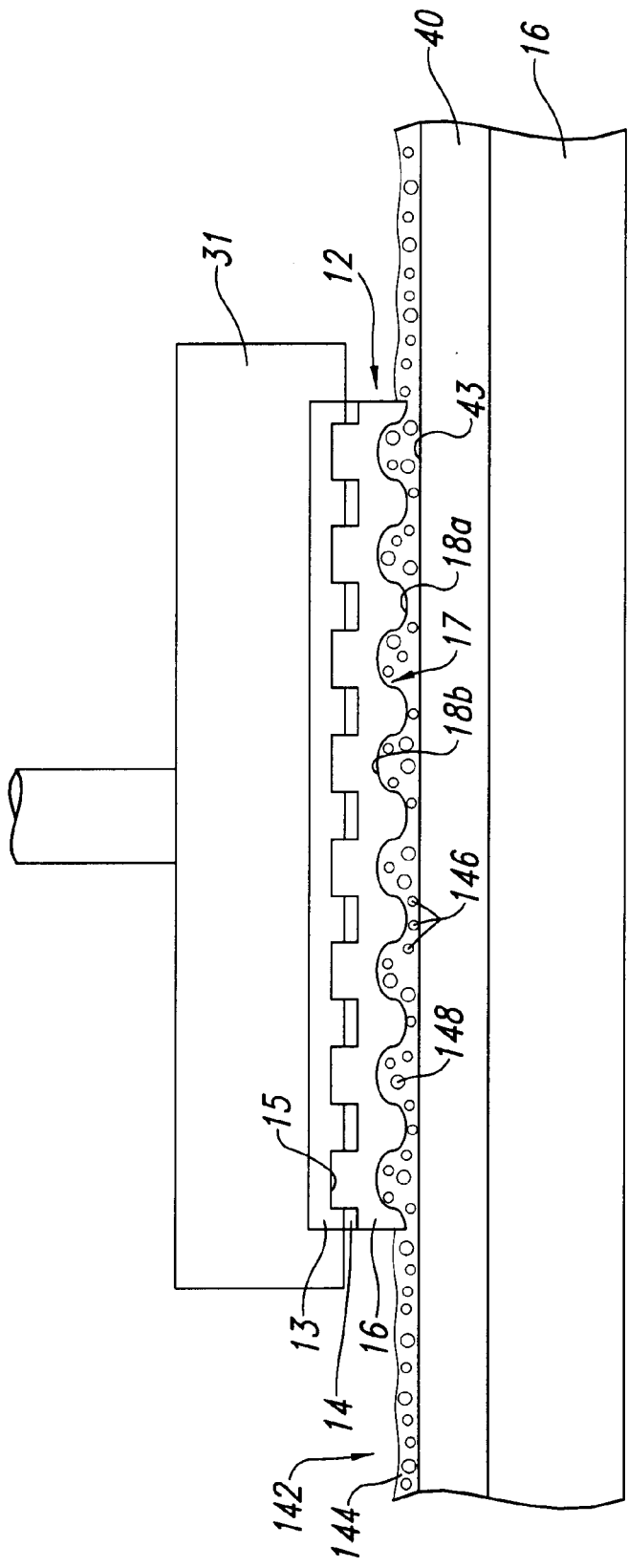
FIG. 4 is a partial schematic cross-sectional view of a substrate assembly being planarized at one stage of a method in accordance with an embodiment of the invention.

FIG. 4 is a schematic cross-sectional view of a substrate assembly 12 being planarized using the planarizing solution 142 at one stage of a planarizing cycle in accordance with an embodiment of a method of the invention. In this example, the substrate assembly 12 has a base layer 13, a polish-stop layer 14 over the base layer 13, and a plurality of trenches 15 etched in the base layer 13 and the polish-stop layer 14. The base layer 13 shown in FIG. 4 is actually a microelectronic-device substrate (e.g., a silicon wafer or a glass substrate), but the base layer 13 can alternatively be a layer of material deposited on a substrate (e.g., a dielectric layer). A cover layer 16 conforms to the topography of the polish-stop layer 14 and fills the trenches 15. At this point of the planarizing cycle, the cover layer 16 accordingly has a topographical substrate surface 17 with a plurality of first regions 18a aligned with the polish-stop layer 14 and second regions 18b aligned with the trenches 15. When the substrate assembly 12 is inverted to face upward, the first regions 18a are typically known as "high regions" and the second regions 18b are typically known as "low regions."

The substrate assembly 12 shown in FIG. 4 is merely a schematic illustration of a semiconductor wafer at a point in a process for constructing either shallow-trench-isolation ("STI") structures using a dielectric cover layer 16 or damascene conductive lines using a conductive cover layer 16. It will be appreciated that the size of the features is greatly exaggerated to better explain the operation of the planarizing solution 142 during the planarizing cycle of the substrate assembly 12. Additionally, although the planarizing solution 142 is described in the context of forming STI structures and damascene lines, it can be used to planarize substrate assemblies having many other and/or different structures.

FIG. 4, more specifically, illustrates the substrate assembly 12 being planarized at a first stage of the planarizing cycle by moving the carrier head 31 to translate the topographical substrate surface 17 across the planarizing surface 43 of the polishing pad 40 and the planarizing solution 142. During the first stage of the planarizing cycle, the smaller first abrasive particles 146 selectively remove material from the first regions 18a much faster than they remove material from the second regions 18b. The topographical selectivity of the small abrasive particles 146 creates a large difference in removal rates between the first and second regions 18a and 18b on the topographical substrate surface 17. The larger second abrasive particles 148, on the other hand, do not have such a large difference in removal rates between the first and second regions 18a and 18b. The smaller first abrasive particles 146 accordingly dominate the removal of material from the substrate assembly during the first stage of the planarizing cycle while the substrate assembly 12 has a topographical substrate surface 17. As a result, many embodiments of the planarizing solution 142 selectively remove material from the first regions 18a faster than the second regions 18b to quickly form a planar blanket surface on the substrate assembly 12.

Figure 5:
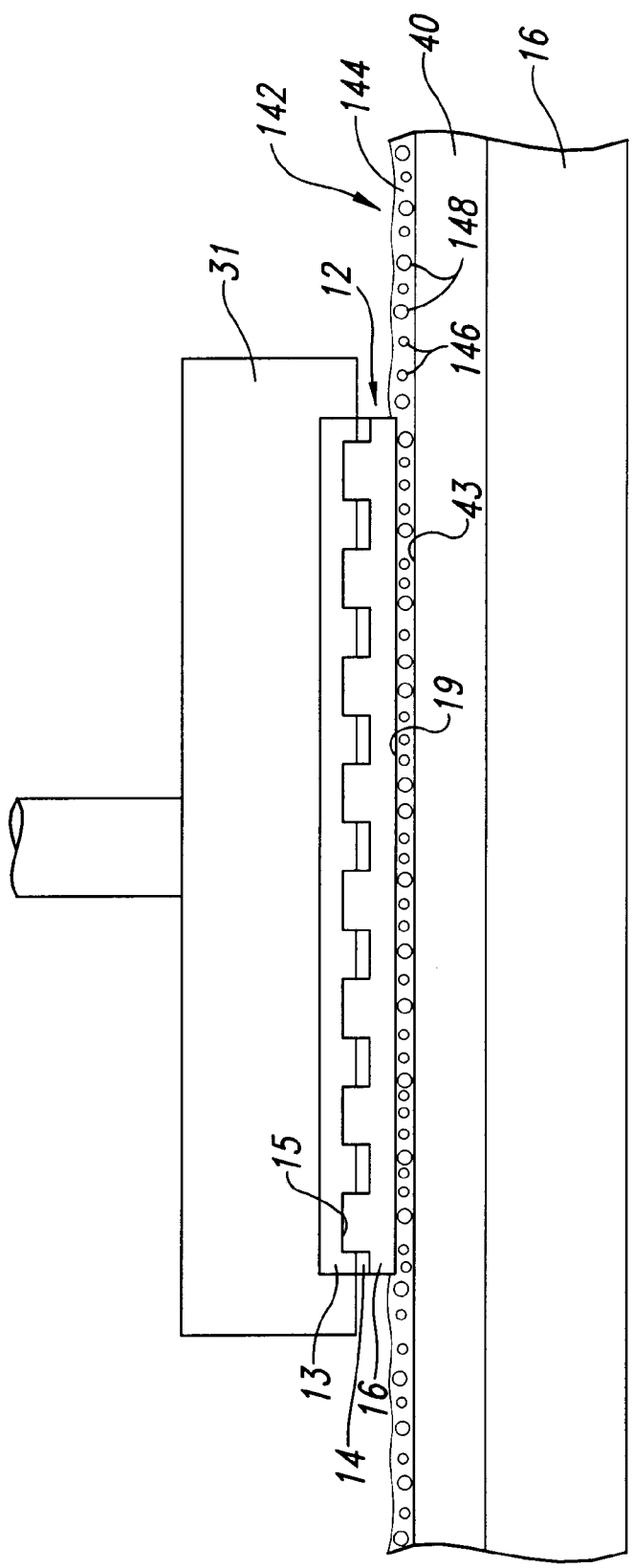
FIG. 5 is a partial schematic cross-sectional view of the substrate assembly of FIG. 4 being planarized a subsequent stage of the method of FIG. 4.

FIG. 5 is a schematic cross-sectional view of the substrate assembly 12 during a second stage of the planarizing cycle in which the substrate assembly 12 has a planar blanket substrate surface 19. During the second stage of the planarizing cycle, the larger second abrasive particles 148 remove material from the blanket substrate surface 19 much faster than the smaller first abrasive particles 146. The second abrasive particles 148 accordingly dominate the second stage of the planarizing cycle to provide a high removal rate of material from the blanket substrate surface 19.

Referring to FIGS. 4 and 5 together, the bi-modal planarizing solution 142 produces more uniformly planar surfaces in less time compared to "singlet slurries" that have a mono-modal particle size distribution of either small or large abrasive particles. The planarizing solution 142 produces a blanket substrate surface because the first abrasive particles 146 selectively remove material from the high regions on the topographical substrate surface much faster than the low regions. The planarizing solution 142 also quickly removes material from the blanket substrate surface because the second abrasive particles 148 have a high polishing rate for blanket substrate surfaces. In contrast to this embodiment of the bi-modal planarizing solution 142, singlet slurries with only small abrasive particles have a very low removal rate of material from blanket substrate surfaces. Moreover, singlet slurries with only large abrasive particles may not selectively remove material from the high regions of a topographical substrate surface in a manner that produces a highly planar blanket substrate surface. Thus, compared to singlet slurries that have either only small or large abrasive particles, the bi-modal particle size planarizing solution 142 is expected to enhance the planarity and reduce the process time of CMP processing.

Figure 6:
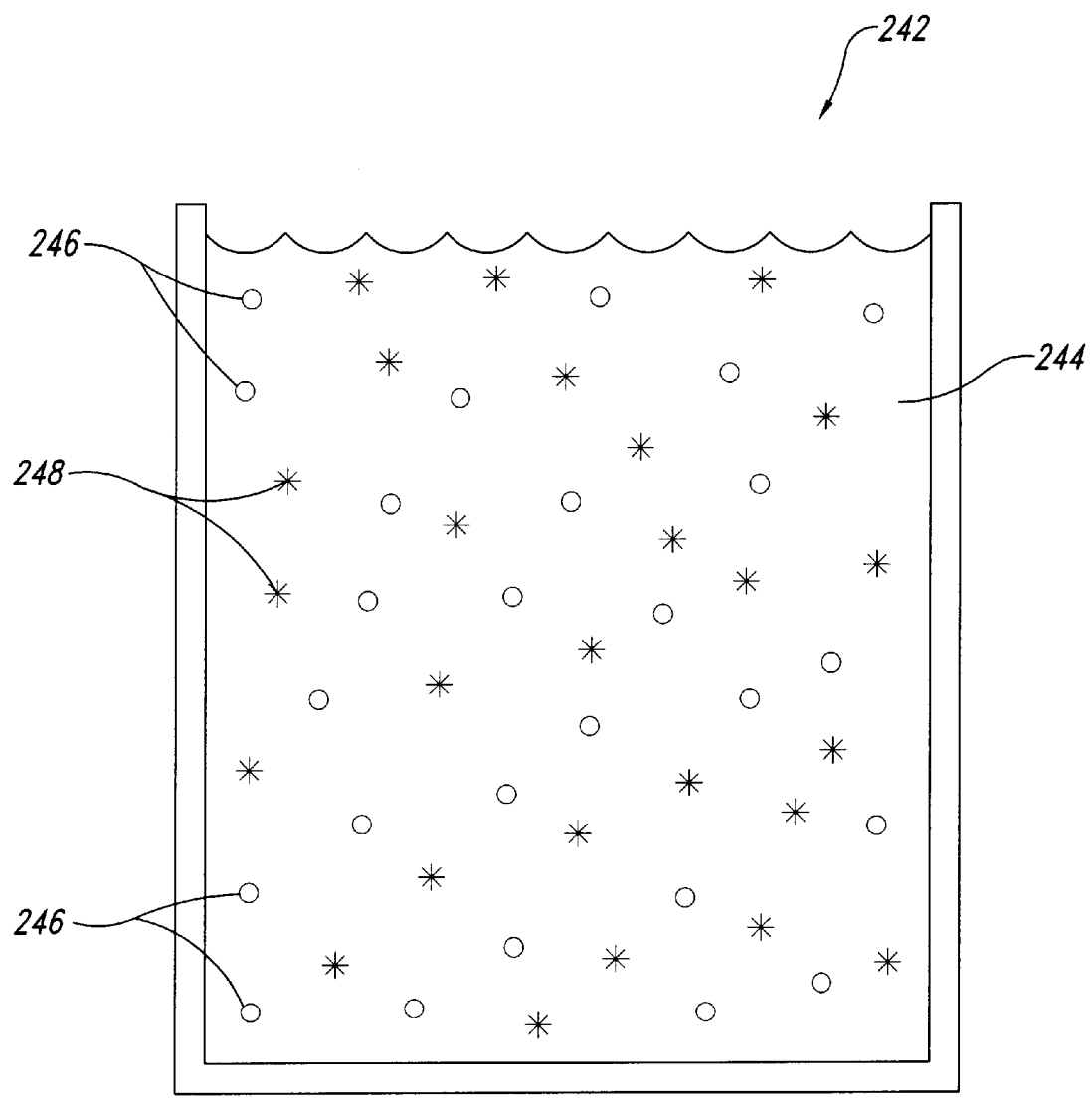
FIG. 6 is a schematic side view of another planarizing solution in accordance with another embodiment of the invention.

FIG. 6 is a schematic view of a planarizing solution 242 in accordance with another embodiment of the invention. In this embodiment, the planarizing solution 242 includes a liquid mixture 244, a plurality of first abrasive particles 246, and a plurality of second abrasive particles 248. The liquid mixture 244 can contain the same components as the liquid mixture 144 of the planarizing solution 142, and the first and second abrasive particles 246 and 248 can also be composed of the materials described above with respect to the first and second planarizing particles 146 and 148. In this embodiment, however, the first planarizing particles 246 are composed of a first material and the second abrasive particles 248 are composed of a second material different than the first material of the first abrasive particles 246. Thus, the planarizing solution 242 is a bi-material solution in which the first and second planarizing attributes of the first and second abrasive particles 246 and 248 are accordingly the first and second materials, respectively.

It is expected that the first and second materials can be selected so that the first and second abrasive particles 246 and 248 selectively remove material from the substrate assembly according to topographical differences across the substrate surface. In one embodiment, the first abrasive particles 246 are composed of a first material that selectively removes high regions on a topographical substrate surface faster than low regions. The second abrasive particles 248 can accordingly be composed of a second material that quickly removes material from a blanket substrate surface. This embodiment of the planarizing solution 242 will thus operate in much the same manner as the bimodal particle size planarizing solution 142.

In another embodiment, the first abrasive particles 246 are composed of a first material that quickly removes the material of the cover layer on the substrate assembly. The second abrasive particles 248 of this embodiment are preferably composed of a second material that selectively removes material from the cover layer either faster or slower than the polish-stop layer to impart the desired planarizing characteristics at the endpoint. The first and second materials of the first and second abrasive particles 246 and 248 can accordingly be selected so that the first and second abrasive particles 246 and 248 selectively remove one type of material on the substrate assembly at a different rate than another type of material.

Figure 7:
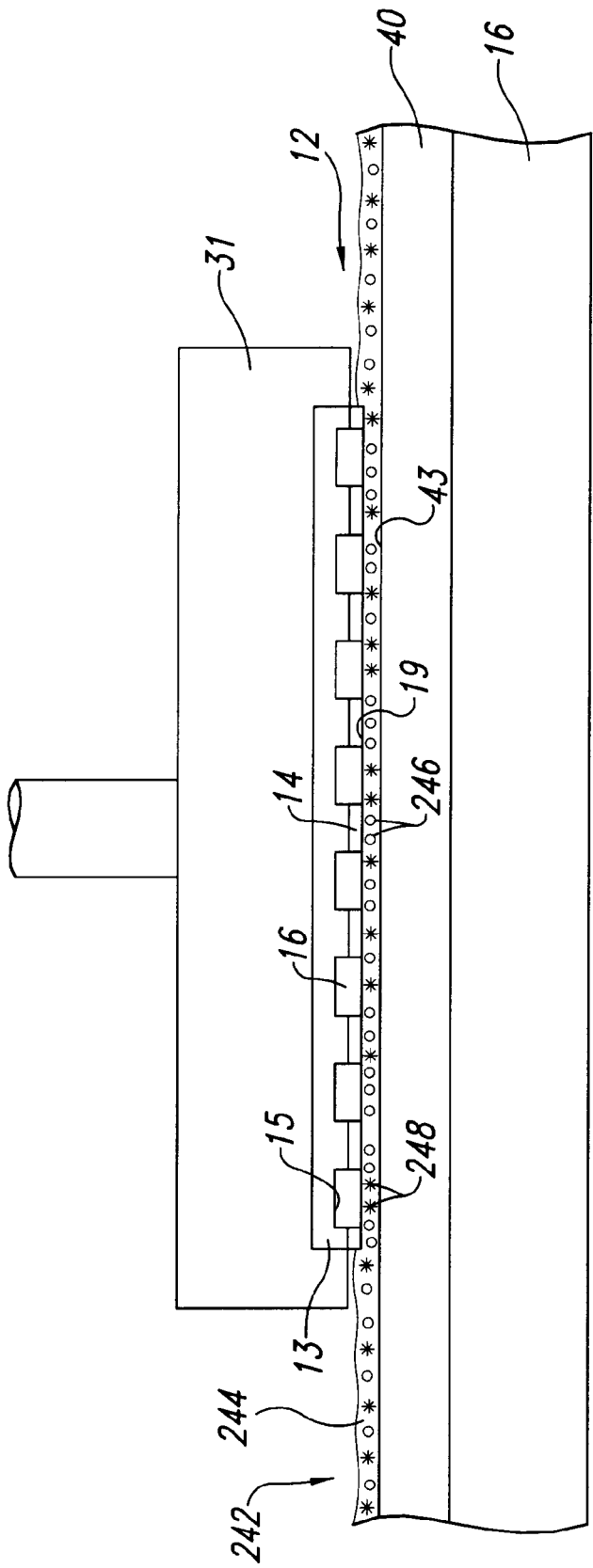
FIG. 7 is a partial schematic cross-sectional view of a substrate assembly being planarized at one stage of another method in accordance with another embodiment of the invention.

FIG. 7 is a schematic cross-sectional view of the substrate assembly 12 being planarized with the planarizing solution 242. The substrate assembly 12, more particularly, is shown near the endpoint of the planarizing cycle when surfaces of the polish-stop layer 14 are exposed to isolate the remaining portions of the cover layer 16 in the trenches 15. The planarizing solution 242 accordingly contacts both the material of the polish-stop layer 14 and the material of the cover layer 16 at this point of the planarizing cycle. It is expected that the second material of the second abrasive particles 248 can be selected so that, compared to the first abrasive particles, the second abrasive particles 248 either: (1) less aggressively planarize the material of the cover layer 16 to avoid dishing between the exposed portions of the polish-stop layer 14; and/or (2) less aggressively planarize the polish-stop layer 14 to avoid over-planarizing beyond the surface of the polish-stop layer 14.

Figure 8:
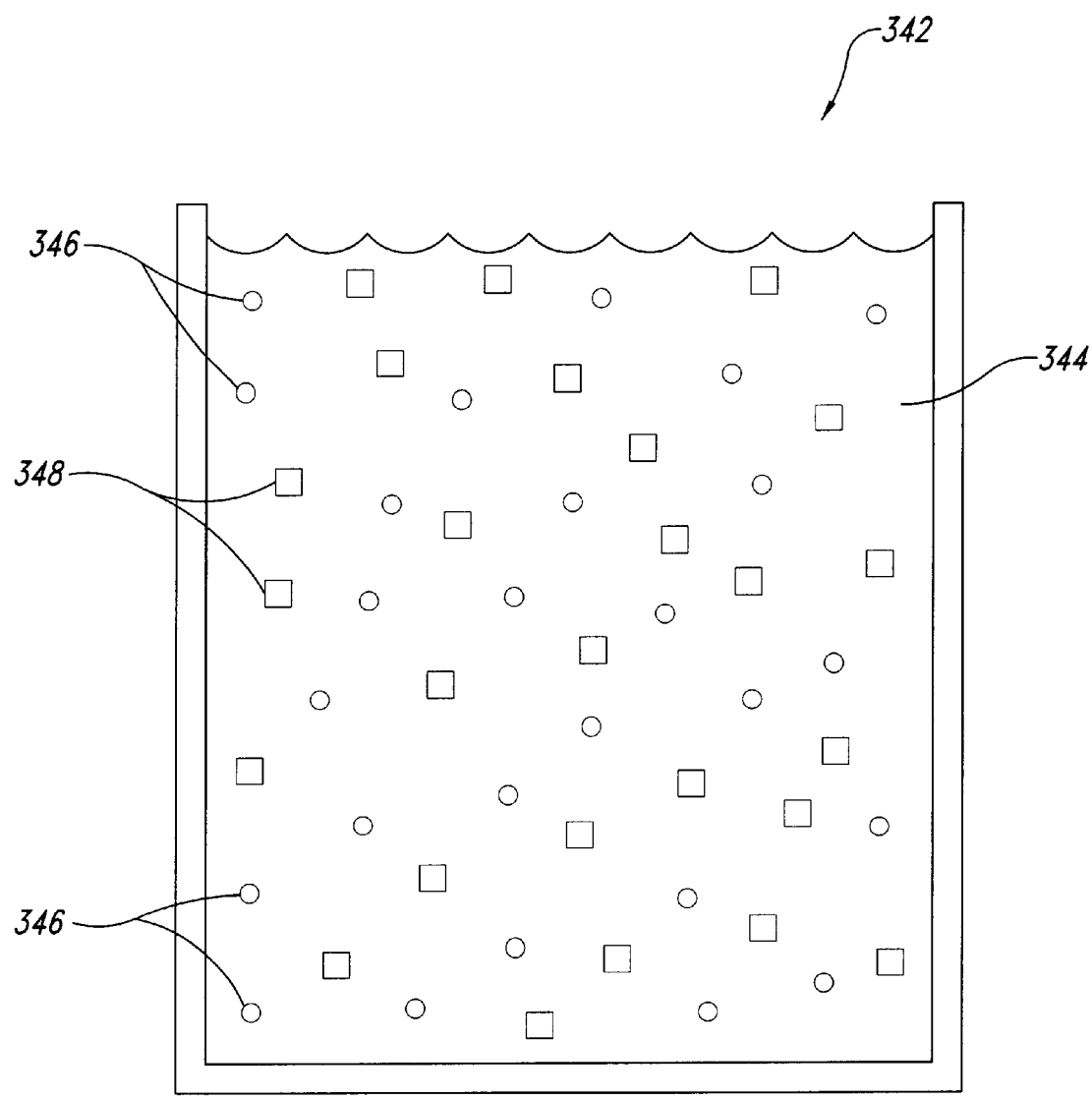
FIG. 8 is a schematic side view of still another planarizing solution in accordance with still another embodiment of the invention.

FIG. 8 is a schematic view of a planarizing solution 342 in accordance with another embodiment of the invention. The planarizing solution 342 also generally includes a liquid mixture 344, a plurality of first abrasive particles 346, and a plurality of second abrasive particles 348. The liquid mixture 344 can contain the same components as the liquid mixture 144 of the planarizing solution 142. In this embodiment, the first planarizing particles 346 have particle sizes in a first particle size distribution with a first mode, and the first abrasive particles 346 are composed of a first material. The first planarizing attribute of the first abrasive particles 346 is thus a combination of both the first particle size distribution and the first material of the abrasive particles. Additionally, the second abrasive particles 348 preferably have particle sizes in a second particle size distribution with a second mode, and the second abrasive particles 348 are preferably composed of a second material. The second planarizing attribute is thus a combination of the second particle size distribution and the second material of the second abrasive particles. The planarizing solution 342, therefore, uses a bi-modal, bi-material solution that selectively planarizes the substrate assembly 12 according to both the topography and the material at the substrate surface.

The first abrasive particles 346 preferably have a relatively small particles sizes and are composed of a material that aggressively abrades the material of the cover layer 16 (FIG. 4) on the substrate assembly 12. The second abrasive particles 348 preferably have relatively large particle sizes and are composed of a material that removes material from the polish-stop layer 14 (FIG. 7) or the cover layer 16 less aggressively than the first abrasive particles 346. The planarizing solution 342 can accordingly selectively remove the high regions from the cover layer 16 to quickly produce a planar blanket substrate surface on the substrate assembly 12 because the first abrasive particles 346 have relatively small particle sizes. The planarizing solution 342 can also have a high polishing rate of the blanket substrate surface because the second abrasive particles 348 have relatively large particle sizes. Moreover, the planarizing solution 342 can also selectively remove one of the cover layer 16 or the polish-stop layer 14 with respect to the other because the larger second abrasive particles 348 dominate the removal of material from the blanket substrate surface and they are composed of a material that is selective to one of these layers. The planarizing solution 342 accordingly operates in a manner that combines the characteristics of the bi-modal planarizing solution 142 and the bi-material planarizing solution 242.

In one particular embodiment for forming damascene lines from a cover layer 16 composed of tungsten, the planarizing solution 342 has a small particle size distribution of first abrasive particles 346 composed of alumina or ceria and a large particle size distribution of second abrasive particles 348 composed of silica. In general, either alumina or ceria more aggressively planarizes tungsten than silica. When the tungsten cover layer 16 is topographical (FIG. 4), the small alumina or ceria first particles 346 aggressively and selectively planarize the first regions 18a from the tungsten cover layer 16. After the tungsten cover layer 16 becomes planar (FIG. 5), the larger silica second abrasive particles 348 dominate the removal of tungsten to maintain a relatively high polishing rate of the blanket substrate surface even though silica is less aggressive to tungsten than alumina or ceria. Additionally, as the blanket surface reaches the endpoint defined by the polish-stop layer 14 (FIG. 7), the silica particles planarize the portions of the tungsten cover layer 16 in the trenches 15 less aggressively than similarly sized alumina or ceria particles to reduce dishing in the trenches 15.

In another particular embodiment for forming damascene lines from a cover layer 16 composed of copper and a polish-stop layer 14 composed of tantalum or tantalum nitride, the planarizing solution 342 has a first distribution of small first abrasive particles 346 composed of alumina and a second distribution of relatively larger second abrasive particles 348 composed of titania. Compared to the small alumina particles 346, the titania abrasive particles 348 less aggressively planarize the tantalum or tantalum oxide polish-stop layer 14 to reduce the removal rate of material from the polish-stop layer 14. Thus, this embodiment of the planarizing solution 342 accordingly has second abrasive particles 348 that avoid over-planarizing the substrate assembly 12 beyond the surface of the polish-stop layer 14.

Figure 1:
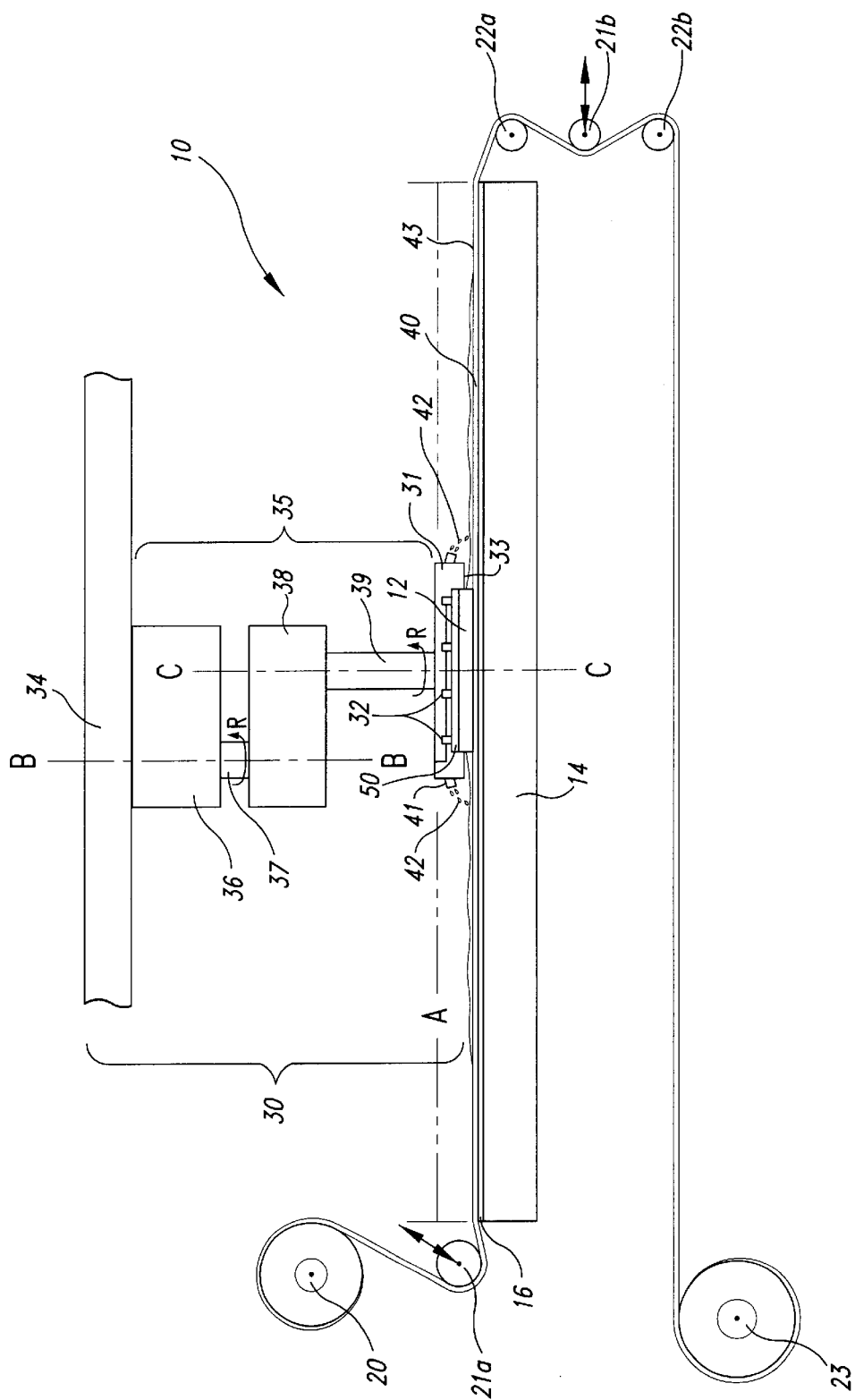
FIG. 1 is a schematic side view of a web-format planarizing machine in accordance with the prior art.
Figure 9:
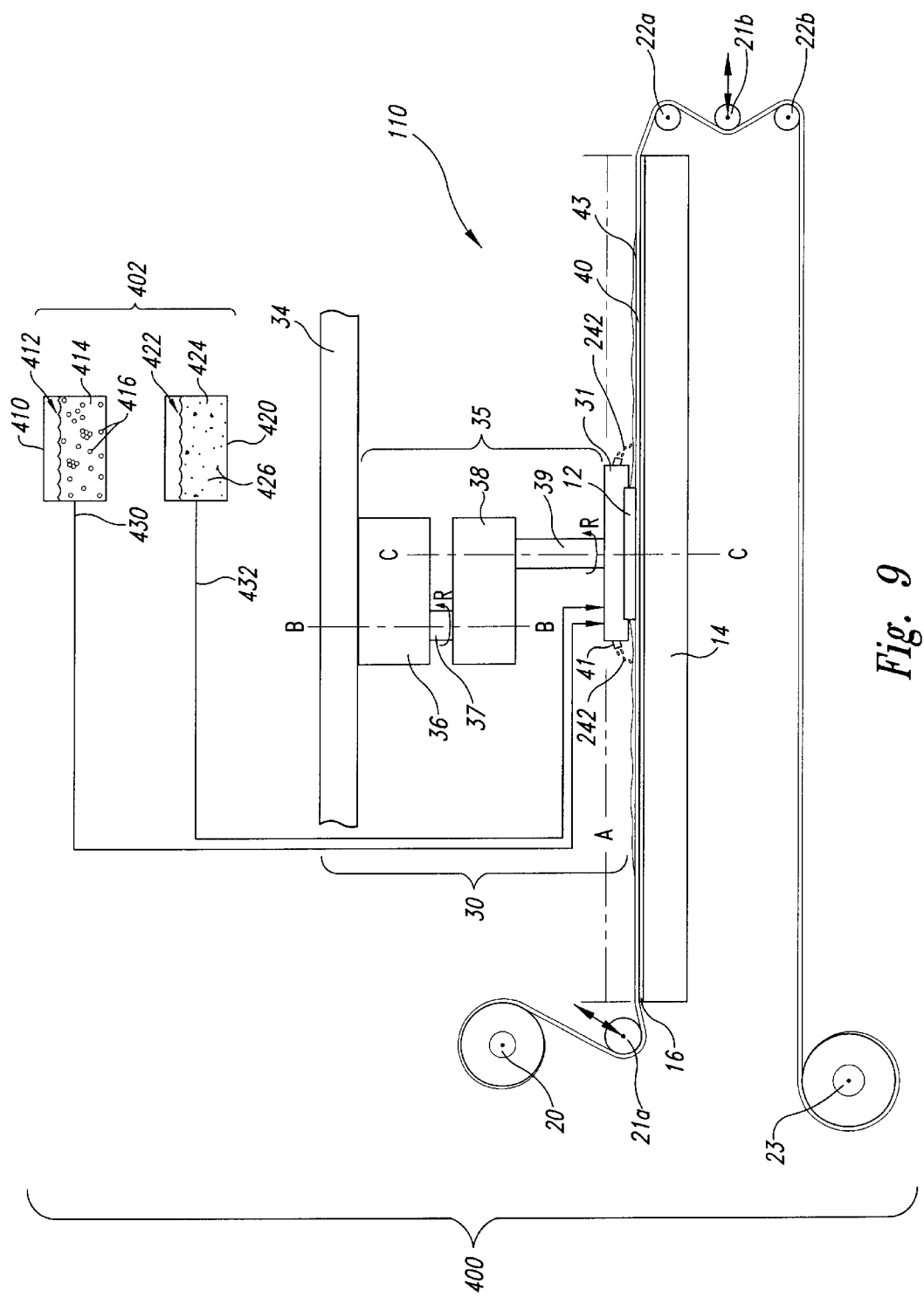
FIG. 9 is a schematic side view of a planarizing system including a planarizing solution distribution assembly and a planarizing machine in accordance with an embodiment of the invention.

FIG. 9 is a schematic side view of a planarizing system 400 having a planarizing machine 110 and a slurry dispensing assembly 402 in accordance with yet another embodiment of the invention. The planarizing machine 110, shown in FIG. 9, is similar to the web-format planarizing machine 10 described above with reference to FIG. 1, and thus like reference numbers refer to like parts. The planarizing machine 110 could also be a rotary planarizing machine having a rotating platen and a circular polishing pad as set forth in U.S. Pat. Nos. 5,645,682 and 5,792,709, which are both herein incorporated by reference. Suitable planarizing machines without the slurry dispensing assembly 402 are manufactured by Obsidian Corporation (web-format), Westech Corporation (rotary), and Strasbaugh Corporation (rotary).

The slurry dispensing assembly 402 generally includes a first supply container 410 containing a first planarizing solution 412 and a second supply container 420 containing a second planarizing solution 422. In this particular embodiment, the carrier head 31 is coupled to the first and second containers 410 and 420 by first and second feed lines 430 and 432, respectively. As explained in detail below, the first and second feed lines 430 and 432 preferably dispense the first and second solutions 412 and 422 at separate first and second stages of a planarizing cycle for the substrate assembly 12.

The first solution 412 includes a liquid mixture 414 and a plurality of first abrasive particles 416. The liquid mixture 414 can be the same as the liquid mixtures 144, 244 and 344 described above, and the first abrasive particles 416 can be the same as the first abrasive particles 146, 246 or 346 described above. Accordingly, the first abrasive particles 416 have a first planarizing attribute that can be the particle size distribution and/or the type of material of the first abrasive particles 416.

The second solution 422 includes a liquid mixture 424 and a plurality of first abrasive particles 426. The liquid mixture 424 can also be the same as the liquid mixtures 144, 244 and 344, and the second abrasive particles 426 can be the same as the second abrasive particles 148, 248 or 348. Accordingly, the second abrasive particles 426 have a second planarizing attribute that can be the particle size distribution and/or the second type of material of the second abrasive particles 426.

One method for planarizing the substrate assembly 12 using the planarizing system 400 includes a single planarizing cycle having a first stage during which the substrate assembly 12 has a topographical substrate surface and a second stage during which the substrate assembly 12 has blanket substrate surface. In the first stage of the planarizing cycle, the carrier head 31 dispenses the first planarizing solution 412 from the nozzles 41 and onto the polishing pad 40. The first abrasive particles 416 preferably have relatively small particle sizes within a first particle size distribution having a first mode. The first abrasive particles 416, for example, can have particles sizes from approximately b $0.010 \mu m$ to $0.050$ $\mu m$ and a first mode of approximately $0.020$–$0.030$ $\mu m$ like the first abrasive particles 146. Thus, during the first stage of the planarizing cycle, the first planarizing solution 412 can planarize high regions on the topographical substrate surface faster than low regions to form a highly planar blanket substrate surface.

Once the first planarizing solution 412 forms a blanket substrate surface on the substrate assembly 12, the planarizing system 400 terminates dispensing the first planarizing solution 412 to stop the first stage of the planarizing cycle and begins dispensing the second planarizing solution 422 to commence the second stage of the planarizing cycle. The second abrasive particles 426 preferably have relatively large particle sizes within a second particle size distribution having a second mode. The second abrasive particles 426, for example, can have particles sizes from approximately $0.070$ $\mu m$ to $0.40$ $\mu m$ and a second mode of approximately $0.25$–$0.30$ $\mu m$ like the second abrasive particles 148. Thus, during the second stage of the planarizing cycle, the second abrasive particles 426 can planarize the blanket substrate surface faster than the first abrasive particles 416 to reduce the time of the planarizing cycle.

In another embodiment of a method for planarizing the substrate assembly 12 using the planarizing system 400, the first planarizing solution 412 has abrasive particles 416 composed of a first material and the second planarizing solution has abrasive particles 426 composed of a second material different than the first material. As explained above with respect to the first abrasive particles 246, the first material of the first abrasive particles 416. preferably aggressively removes material from the cover layer 16 (FIG. 4). The first planarizing solution 412 is accordingly dispensed onto the polishing pad 40 during the first stage of the planarizing cycle while the substrate assembly 12 has a topographical substrate surface. Additionally, as explained above with respect to the second abrasive particles 248, the second material of the second abrasive particles 426 is preferably selected to less aggressively remove material from either the exposed portions of the polish-stop layer 14 (FIG. 7) or the remaining portions of the cover layer 16 (FIG. 7) at the endpoint of the planarizing cycle. The second planarizing solution 422 is dispensed onto the polishing pad 40 during the second stage of the planarizing cycle to planarize the blanket substrate surface and to provide the desired selectivity to the polish-stop layer or the cover layer at the endpoint.

In one particular application of this two-stage method, tungsten damascene lines are formed from a tungsten cover layer by initially dispensing a first planarizing solution 412 having alumina first abrasive particles 416 during the first stage of the planarizing cycle. This embodiment of the method continues by subsequently dispensing a second planarizing solution 422 having silica second abrasive particles 426 during the second stage. In another particular application of this two-stage method, copper contacts or damascene lines are formed from a copper cover layer over a tantalum polish-stop layer by 30 initially dispensing a first planarizing solution 412 having alumina first abrasive particles 416 during the first stage of the planarizing cycle. This embodiment of the method continues by dispensing a second planarizing solution 422 having titania second abrasive particles 426 during the second stage. In either of these embodiments, the first abrasive particles 416 preferably have small first particle sizes in a first particle size distribution and the second abrasive particles 426 preferably have particle sizes in a second particle size distribution that are larger than the first abrasive particles 416.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A method of planarizing a microelectronic-device substrate assembly, comprising:
    abrading a first portion of the substrate assembly by contacting the substrate assembly with a plurality of first abrasive particles having a first size distribution, the first portion having a topological surface; and
    removing material from a second portion of the substrate assembly by contacting the substrate assembly with a second plurality of abrasive particles having a second size distribution, the first and second size distributions being different from one another, wherein the second portion has an approximately planar surface that is spaced apart from a polish stop layer.

2. The method of claim 1 wherein abrading and removing material from the substrate assembly comprises dispensing a planarizing solution including a mixture of both the first and second abrasive particles onto a polishing pad, pressing the substrate assembly against the first and second abrasive particles on the polishing pad, and translating at least one of the polishing pad or the substrate assembly with respect to the other.

3. The method of claim 2 wherein dispensing the planarizing solution comprises depositing a bi-modal solution onto the pad in which the first abrasive particles have a first particle size distribution with a first mode and the second abrasive particles have a second particle size distribution with a second mode different than the first mode.

4. The method of claim 3 wherein depositing the bi-modal solution comprises covering at least a portion of the polishing pad with a bi-modal solution in which the first particle size distribution is from approximately 0.020–0.20 μm and the first mode is approximately 0.09–0.15 μm, and the second particle size distribution is from approximately 0.20–1.0 μm and the second mode is approximately 0.3–0.4 μm.

5. The method of claim 2 wherein dispensing the planarizing solution comprises depositing a bi-material solution onto the pad in which the first abrasive particles are composed of a first material type and the second abrasive particles are composed of a second material type.

6. The method of claim 5 wherein depositing the bi-material solution comprises covering at least a portion of the polishing pad with a bi-material solution in which the first abrasive particles comprise ceria particles and the second abrasive particles comprise silica particles.

7. The method of claim 5 wherein depositing the bi-material solution comprises covering at least a portion of the polishing pad with a bi-material solution in which the first abrasive particles comprise alumina and the second abrasive particles comprise titania.

8. The method of claim 5 wherein depositing the bi-material solution comprises covering at least a portion of the polishing pad with a bi-material solution in which the first and second abrasive particles comprise particles composed of different first and second material types selected from the group consisting of alumina, aluminum oxide, ceria, silicon dioxide, titania, tantalum oxide, ceria treated silica and silica.

9. The method of claim 2 wherein dispensing the planarizing solution comprises depositing a bi-modal and bi-material solution onto the pad in which the first abrasive particles have a first planarizing attribute comprising a first particle size distribution having a first mode and a first material type, and the second abrasive particles have a second planarizing attribute comprising a second particle size distribution having a second mode and a second material type.

10. The method of claim 9 wherein dispensing the planarizing solution comprises depositing a bi-modal and bi-material solution in which:
    the first particle size distribution is from approximately 0.010–0.050 μm and the first mode is approximately 0.02–0.03 μm, and the second particle size distribution is from approximately 0.070–0.40 μm and the second mode is approximately 0.25–0.3 μm; and
    the first and second abrasive particles comprise particles composed of different first and second material types selected from the group consisting of alumina, aluminum oxide, ceria, silicon dioxide, titania, tantalum oxide, ceria treated silica and silica.

11. The method of claim 1 wherein:
    abrading material from the substrate assembly with the first abrasive particles comprises dispensing a first planarizing solution having the first abrasive particles onto a polishing pad during a first stage of the planarizing cycle, pressing the substrate assembly against the first abrasive particles on the polishing pad, and translating at least one of the polishing pad or the substrate assembly with respect to the other; and removing material from the substrate assembly with the second abrasive particles comprises dispensing a second planarizing solution having the second abrasive particles onto a polishing pad during a second stage of the planarizing cycle subsequent to the first stage, pressing the substrate assembly against the second abrasive particles on the polishing pad, and translating at least one of the polishing pad or the substrate assembly with respect to the other.

12. The method of claim 11 wherein dispensing the first and second planarizing solutions comprises depositing a first planarizing solution onto the pad in which the first abrasive particles are a first material type and separately depositing a second planarizing solution onto the pad in which the second abrasive particles are a second material type.

13. The method of claim 12 wherein dispensing the first and second planarizing solutions comprises depositing a first planarizing solution onto the pad in which the first abrasive particles comprise ceria particles and separately depositing a second planarizing solution onto the pad in which the second abrasive particles comprise silica particles.

14. The method of claim 12 wherein dispensing the first and second planarizing solutions comprises depositing a first planarizing solution onto the pad in which the first abrasive particles comprise alumina and separately depositing a second planarizing solution onto the pad in which the second abrasive particles comprise titania.

15. The method of claim 12 wherein dispensing the first and second planarizing solutions comprises separately depositing first and second planarizing solutions onto the pad in which the first and second abrasive particles comprise particles composed of different first and second material types selected from the group consisting of alumina, aluminum oxide, ceria, silicon dioxide, titania, tantalum oxide, ceria treated silica and silica.

16. The method of claim 11 wherein dispensing the first solution comprises depositing a first planarizing solution onto the pad in which the first abrasive particles have a first planarizing attribute comprising a first particle size distribution having a first mode and a first material type, and separately depositing a second planarizing solution onto the pad in which the second abrasive particles have a second planarizing attribute comprising a second particle size distribution having a second mode and a second material type.

17. A method of planarizing a microelectronic-device substrate assembly having a cover layer, an underlying layer under the cover layer, and a polish stop layer interposed between the cover layer and the underlying layer, comprising removing material from a surface of the substrate assembly using first and second abrasive particles contained in a single planarizing solution, the first abrasive particles having a first particle size distribution with a first mode and the second abrasive particles having a second particle size distribution with a second mode.

18. The method of claim 17 wherein depositing the bi-modal solution comprises covering at least a portion of the polishing pad with a bi-modal solution in which the first particle size distribution is from approximately 0.010–0.200 $\mu$m and the first mode is approximately 0.020–0.150 $\mu$m, and the second particle size distribution is from approximately 0.070–1.000 $\mu$m and the second mode is approximately 0.250–0.400 $\mu$m.

19. A method of planarizing a microelectronic-device substrate assembly having a cover layer composed of a first material, an underlying layer composed of a second material under the cover layer, and a polish stop layer interposed between the cover layer and the underlying layer comprising removing material from a surface of the substrate assembly using first and second abrasive particles contained in a single planarizing solution, the first abrasive particles having a first planarizing attribute defined by a first type of material and a first particle size distribution with a first mode and the second abrasive particles having a second planarizing attribute defined by a second type of material and a second particle size distribution with a second mode.

20. The method of claim 19 wherein removing material from the substrate assembly comprises depositing a single planarizing solution onto the pad in which the first abrasive particles remove matter from the cover layer at a first removal rate and the second abrasive particles remove matter from the cover layer at a second removal rate.

21. The method of claim 19 wherein removing material from the substrate assembly comprises depositing a single planarizing solution onto the pad in which the first abrasive particles comprise ceria and the second abrasive particles comprise silica.

22. The method of claim 19 wherein removing material from the substrate assembly comprises depositing a single planarizing solution onto the pad in which the first abrasive particles comprise alumina and the second abrasive particles comprise titania.

23. The method of claim 19 wherein removing material from the substrate assembly comprises depositing a single planarizing solution onto the pad in which the first abrasive particles and the second abrasive particles comprise different materials selected from the group consisting of alumina, aluminum oxide, ceria, silicon dioxide, titanium oxide, titania, ceria treated silica and silica.

24. The method of claim 19 wherein depositing the single planarizing solution comprises covering at least a portion of a polishing pad with a solution in which the first particle size distribution is from approximately 0.010–0.050 $\mu$m with a first mode at approximately 0.02–0.03 $\mu$m and the second particle size distribution is from approximately 0.070–0.40 $\mu$m with a second mode at approximately 0.25–0.30 $\mu$m.

25. A method of planarizing a microelectronic-device substrate assembly having a cover layer, an underlying layer under the cover layer, and a polish stop layer interposed between the cover layer and the underlying layer comprising removing material from a surface of the substrate assembly using first and second abrasive particles contained in a single planarizing solution, the first abrasive particles having a first planarizing attribute defined by a first particle size distribution and a first material type and the second abrasive particles having second planarizing attribute defined by a second particle size distribution and a second material type.

26. The method of claim 25 wherein removing material from the substrate assembly comprises depositing a single planarizing solution onto the pad in which the first abrasive particles remove matter from the cover layer at a first removal rate and the second abrasive particles remove from the cover layer at a second removal rate.

27. The method of claim 25 wherein removing material from the substrate assembly comprises depositing a single planarizing solution onto the pad in which the first abrasive particles comprise ceria and the second abrasive particles comprise silica.

28. The method of claim 25 wherein removing material from the substrate assembly comprises depositing a single planarizing solution onto the pad in which the first abrasive particles comprise alumina and the second abrasive particles comprise titania.

29. The method of claim 25 wherein removing material from the substrate assembly comprises depositing a single planarizing solution onto the pad in which the first abrasive particles and the second abrasive particles comprise different materials selected from the group consisting of alumina, aluminum oxide, ceria, silicon dioxide, titanium oxide, titania, ceria treated silica and silica.

30. The method of claim 25 wherein depositing the single planarizing solution comprises covering at least a portion of a polishing pad with a solution in which the first abrasive particles have particle sizes in a first particle size distribution from approximately 0.020–0.20 μm with a first mode at approximately 0.09–0.11 μm and the second abrasive particles have particle sizes in a second particle size distribution from approximately 0.20–1.0 μm with a second mode at approximately 0.3–0.4 μm.

31. A method of planarizing a microelectronic-device, substrate assembly comprising:

dispensing a first planarizing solution onto a polishing pad, the first solution including a plurality of first abrasive particles having a first planarizing attribute defined by a first particle size distribution;

abrading material from the substrate assembly during a first stage of a planarizing cycle of the substrate assembly interrupting the dispensing of the first planarizing solution;

dispensing a second planarizing solution onto the polishing pad, the second solution including a plurality of second abrasive particles having a second planarizing attribute defined by a second particle size distribution; and removing material from the substrate assembly during a second stage of the planarizing cycle, the second stage of the planarizing cycle being after the first stage of the planarizing cycle.

32. The method of claim 31 wherein:

abrading material from the substrate assembly comprises pressing the substrate assembly against the first abrasive particles on the polishing pad, and translating at least one of the polishing pad or the substrate assembly with respect to the other; and removing material from the substrate assembly with the second abrasive particles comprises pressing the substrate assembly against the second abrasive particles on the polishing pad, and translating at least one of the polishing pad or the substrate assembly with respect to the other.

33. The method of claim 31 wherein dispensing the first and second planarizing solutions comprises depositing a first planarizing solution onto the pad in which the first planarizing attribute of the first abrasive particles is further defined by a first material type and separately depositing a second planarizing solution onto the pad in which the second planarizing attribute of the second abrasive particles is further defined by a second material type.

34. The method of claim 33 wherein dispensing the first and second planarizing solutions comprises depositing a first planarizing solution onto the pad in which the first abrasive particles comprise ceria particles and separately depositing a second planarizing solution onto the pad in which the second abrasive particles comprise silica particles.

35. The method of claim 33 wherein dispensing the first and second planarizing solutions comprises depositing a first planarizing solution onto the pad in which the first abrasive particles comprise alumina and separately depositing a second planarizing solution onto the pad in which the second abrasive particles comprise titania.

36. The method of claim 33 wherein dispensing the first and second planarizing solutions comprises separately depositing first and second planarizing solutions onto the pad in which the first and second abrasive particles comprise particles composed of different first and second material types selected from the group consisting of alumina, aluminum oxide, ceria, silicon dioxide, titanium oxide, tantalum oxide, ceria treated silica and silica.

37. The method of claim 31 wherein dispensing the first solution comprises depositing a first planarizing solution onto the pad in which the first planarizing attribute of the first abrasive particles comprises a first particle size distribution having a first mode and a first material type, and separately depositing a second planarizing solution onto the pad in which the second planarizing attribute of the second abrasive particles comprises a second particle size distribution having a second mode and a second material type.

38. A method of planarizing a microelectronic-device, substrate assembly comprising:

dispensing a first planarizing solution onto a polishing pad during a first stage of a planarizing cycle of the substrate assembly, the first planarizing solution including a plurality of first abrasive particles having a first abrasive attribute that selectively removes material from the substrate assembly according to at least one of a surface contour of the substrate assembly and/or a material type at the planarizing surface;

removing material from the substrate assembly during the first stage by pressing the substrate assembly against the first abrasive particles and the polishing pad and translating at least one of the substrate assembly or the polishing pad to abrade the substrate assembly with the first abrasive particles;

interrupting the dispensing of the first planarizing solution;

depositing a second planarizing solution onto a polishing pad during a second stage of the planarizing cycle after the first stage, the second planarizing solution including a plurality of second abrasive particles having a second abrasive attribute that selectively removes material from the substrate assembly according to at least one of a surface contour of the substrate assembly and/or a material type at the planarizing surface; and removing additional material from the substrate assembly during the second stage of the planarizing cycle by pressing the substrate assembly against the second abrasive particles and the polishing pad and translating at least one of the substrate assembly or the polishing pad to abrade the substrate assembly with the second abrasive particles.

* * * * *